US012757667B2

(12) United States Patent
Chen et al.

(10) Patent No.: US 12,757,667 B2
(45) Date of Patent: Oct. 6, 2026

(54) CHEMICAL LIQUID SUPPLY EQUIPMENT AND CHEMICAL LIQUID SUPPLY METHOD

(71) Applicant: Marketech International Corp., Taipei City (TW)

(72) Inventors: Ping-Hsu Chen, Taichung City (TW); Chien-Kuo Lu, Hsinchu City (TW)

(73) Assignee: Marketech International Corp., Taipei City (TW)

( * ) Notice: Subject to any disclaimer, the term of this patent is extended or adjusted under 35 U.S.C. 154(b) by 538 days.

(21) Appl. No.: 18/464,296

(22) Filed: Sep. 11, 2023

(65) Prior Publication Data

US 2024/0234168 A1 Jul. 11, 2024

(30) Foreign Application Priority Data

Jan. 7, 2023 (TW) ................................ 112100772

(51) Int. Cl.
*H10P 72/00* (2026.01)
*B67B 7/18* (2006.01)

(52) U.S. Cl.
CPC .......... *H10P 72/0402* (2026.01); *B67B 7/182* (2013.01); *B65G 2201/02* (2013.01)

(58) Field of Classification Search
None
See application file for complete search history.

(56) References Cited

U.S. PATENT DOCUMENTS

2019/0127206 A1* 5/2019 Lu ......................... B23P 19/046

FOREIGN PATENT DOCUMENTS

KR 20170017958 A * 2/2017 ............... B67C 3/26

* cited by examiner

*Primary Examiner* — Jason Berman
(74) *Attorney, Agent, or Firm* — CKC & Partners Co., LLC

(57) ABSTRACT

A chemical liquid supply equipment includes a casing, a connection module and a chemical drum rotating and conveying module. The casing has a chemical drum accommodating room, the connection module is installed in the chemical drum accommodating room of the casing, and the chemical drum rotating and conveying module is also installed in the chemical drum accommodating room of the casing to transport a chemical drum into the chemical drum accommodating room, and the chemical drum is rotated to align with the connecting module.

16 Claims, 6 Drawing Sheets

CHEMICAL LIQUID SUPPLY EQUIPMENT AND CHEMICAL LIQUID SUPPLY METHOD

RELATED APPLICATIONS

This application claims priority to Taiwan application Ser. No. 11/210,0772, filed Jan. 7, 2023, the disclosures of which are incorporated herein by reference in their entireties.

TECHNICAL FIELD

The present disclosure relates to a chemical liquid supply equipment and chemical liquid supply method. More particularly, the present disclosure relates to a chemical liquid supply equipment and chemical liquid supply method able to automatically align with a chemical drum.

BACKGROUND

With the booming of the domestic and international semiconductor markets in recent years, due to the demand for computers and the peripheral products thereof, the semiconductor industry has continued to expand, and created a large amount of foreign exchange earnings.

The manufacturing processes of semiconductor components are very complicated, and the technologies involved cover almost all of the most important and critical technologies and inventions of modern scientific research. Therefore, the semiconductor industry is not only a cutting-edge technology industry, but also requires a lot of money to maintain high-end research.

Due to the increasingly complicated design of semiconductor components, the manufacturing technologies of semiconductor components are becoming more sophisticated and complex, and the potential occupational hazards and property losses are becoming more serious in semiconductor processes. Chemicals are commonly used in processes such as epitaxy, diffusion, ions implantation, chemical vapor deposition, etching and lithography. The storage and usage in the semiconductor fabrication plant is much less than the storage and usage in a chemical or petrochemical plant. However, since the chemicals are flammable, toxic and corrosive, the chemical substances may cause personal injury and serious property damage if leakage or abnormal operation occurs.

In a semiconductor fabrication plant, chemical liquids are stored in chemical storage containers to connect to a supply line in the semiconductor fabrication plant. When the chemical liquid is used up, the chemical storage container need to be replaced.

There is a need to conveniently replace the chemical storage container so as to improve the safety of the semiconductor fabrication plant and further improve the yield of the semiconductor fabrication plant.

SUMMARY

The summary of the present invention is intended to provide a simplified description of the disclosure to enable readers to have a basic understanding of the disclosure. The summary of the present invention is not a complete overview of the disclosure, and it is not intended to point out the importance of the embodiments/key elements of the present invention or define the scope of the invention.

One objective of the embodiments of the present invention is to provide a chemical liquid supply equipment able to automatically align with the chemical drum so as to conveniently supply the chemical liquid required for production and conveniently replace the chemical storage container, and the safety and convenience of changing the chemical storage container are therefore improved.

To achieve these and other advantages and in accordance with the objective of the embodiments of the present invention, as the embodiment broadly describes herein, the embodiments of the present invention provides a chemical liquid supply equipment including a casing, a connection module and a chemical drum rotating and conveying module. The casing has a chemical drum accommodating room, the connection module is equipped in the chemical drum accommodating room of the casing and the chemical drum rotating and conveying module is also equipped in the chemical drum accommodating room of the casing to transport the chemical drum into the chemical drum accommodating room and rotate the chemical drum to align with the connection module.

In some embodiments, the chemical liquid supply equipment further includes a guiding plate disposed in the chemical drum accommodating room of the casing, and the guiding plate is located between the connection module and the chemical drum rotating and conveying module to guide the chemical drum.

In some embodiments, the chemical drum rotating and conveying module, includes a first conveying device and a second conveying device. The first conveying device and the second conveying device are disposed in parallel to move or rotate the chemical drum.

In some embodiments, the first conveying device and the second conveying device respectively include a plurality of first power rollers, a plurality of first idler rollers, a plurality of second power rollers and a plurality of second idler rollers. The first idler rollers are disposed in parallel with the first power rollers, the second power rollers are disposed in parallel with the first power rollers and the first idler rollers, and the second idler rollers are disposed in parallel with the first power rollers, the first idler rollers and the second idler rollers.

In some embodiments, a length of the first power rollers is greater than a length of the second power rollers, and a length of the first idler rollers is greater than a length of the second idler rollers.

In some embodiments, the length of the first power rollers is equal to the length of the first idler rollers, and the length of the second power rollers is equal to the length of the second idler rollers.

In some embodiments, the connection module includes a first connection module and a second connection module. The first connection module connects to a gas opening of the chemical drum and the second connection module is disposed opposite to the first connection module to connect to a liquid opening of the chemical drum.

In some embodiments, the first connection module includes a cap rotation device, a pipeline connection device and an optical detecting device. The cap rotation device rotates a chemical drum sealing cap of the gas opening of the chemical drum, the pipeline connection device connects the gas opening of the chemical drum and the optical detecting device is disposed between the cap rotation device and the pipeline connection device to detect a position of the gas opening of the chemical drum.

In some embodiments, the second connection module includes a cap rotation device, a pipeline connection device and an optical detecting device. The cap rotation device rotates a chemical drum sealing cap of the liquid opening of the chemical drum, the pipeline connection device connects the liquid opening to draw or reflow a chemical liquid of the chemical drum, and the optical detecting device is disposed between the cap rotation device and the pipeline connection device of the second connection module, to detect a position of the liquid opening of the chemical drum.

In some embodiments, the cap rotation device of the first connection module is 180 degrees away from the cap rotation device of the second connection module, and the pipeline connection device of the first connection module is 180 degrees away from the pipeline connection device of the second connection module.

According to another aspect of the present invention, the chemical liquid supply method is provided and includes the following steps. A chemical drum is first provided. The chemical drum is transported by a chemical drum rotating and conveying module of a chemical liquid supply equipment to enter into a chemical drum accommodating room of the chemical liquid supply equipment. An opening of the chemical drum is detected. Then, the chemical drum is rotated by the chemical drum rotating and conveying module to align the opening of the chemical drum with a cap rotation device of a connection module of the chemical liquid supply equipment.

In some embodiments, the chemical liquid supply method further includes a step of rotating a chemical drum sealing cap with the cap rotation device to open the chemical drum and holding the chemical drum sealing cap with the cap rotation device.

In some embodiments, the chemical liquid supply method further includes a step of connecting the opening with a pipeline connection device of the chemical liquid supply equipment.

In some embodiments, the chemical liquid supply method further includes a step of drawing a chemical liquid of the chemical drum with the pipeline connection device.

In some embodiments, the chemical liquid supply method further includes a step of detaching the pipeline connection device from the opening of the chemical drum.

In some embodiments, the chemical liquid supply method further includes a step of rotating the chemical drum sealing cap held in the cap rotation device to fix on the opening of the chemical drum.

In some embodiments, the chemical liquid supply method further includes a step of moving the chemical drum out of the chemical drum accommodating room by the chemical drum rotating and conveying module.

In some embodiments, the opening of the chemical drum includes a gas opening or a liquid opening.

In some embodiments, the chemical liquid supply method further includes a step of intaking an air for the chemical drum.

In some embodiments, the chemical liquid supply method further includes a step of exhausting an air from the chemical drum.

Hence, the chemical liquid supply equipment may safely and reliably connect the chemical drum with the connection module, and utilize the chemical drum rotating and conveying module to conveniently and precisely align the connection module with the chemical drum so as to effectively reduce the required length and the rotational angle of the pipelines and improve the efficiency and precision of the installation and removal of the chemical drum in the chemical liquid supply equipment.

BRIEF DESCRIPTION OF THE DRAWINGS

The disclosure can be more fully understood by reading the following detailed description of the embodiment, with reference made to the accompanying drawings as follows.

DETAILED DESCRIPTION OF THE PREFERRED EMBODIMENT

Figure 1:
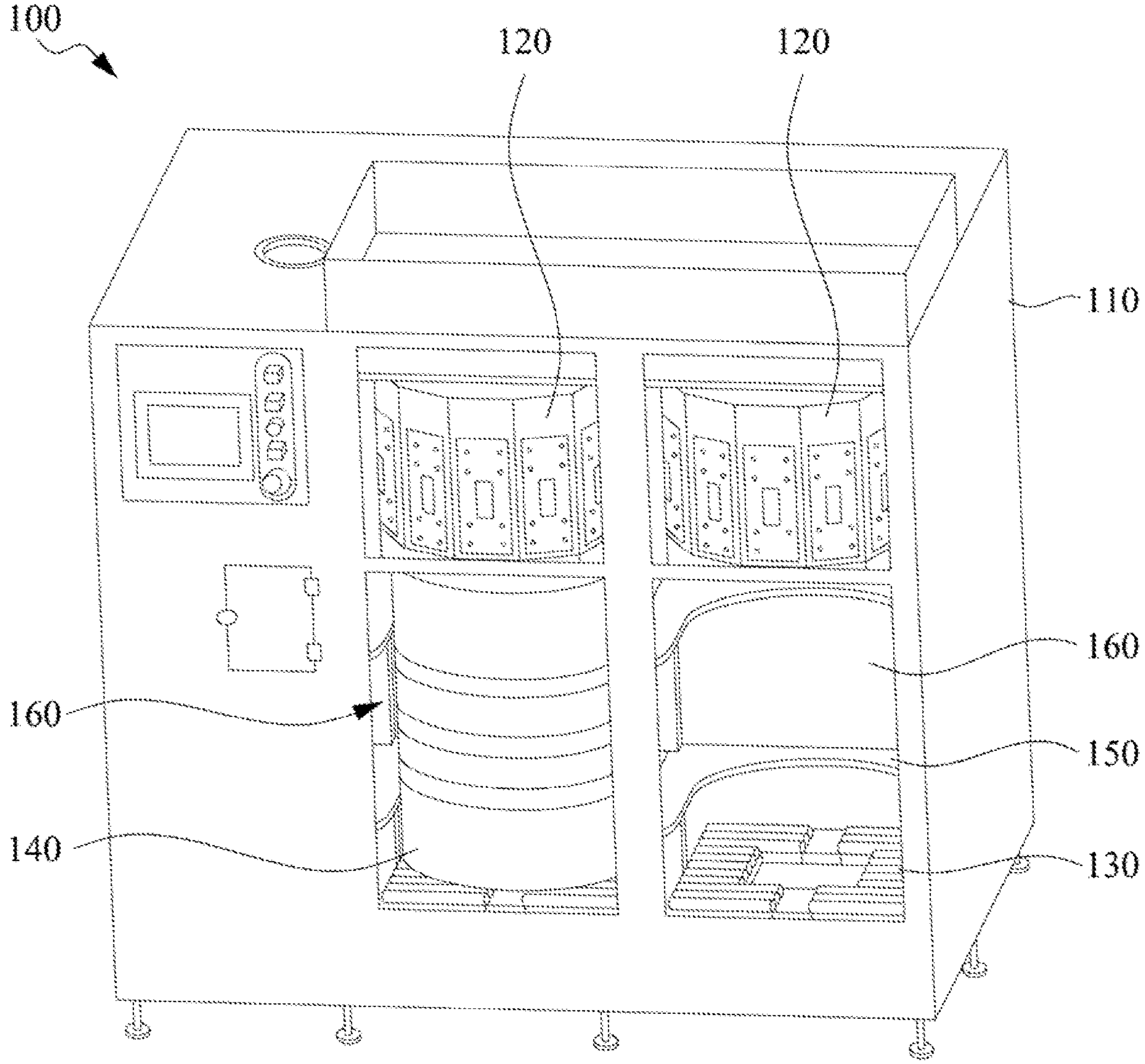
FIG. 1 illustrates a schematic diagram showing a chemical liquid supply equipment according to one embodiment of the present invention.

The following is a detailed description of the embodiments in conjunction with the accompanying drawings, but the provided embodiments are not intended to limit the scope of the disclosure, and the description of the structure and operation is not used to limit the execution sequence thereof. The structure of the recombination of components and the resulting devices with equal functions are all within the scope of this disclosure. In addition, the drawings are for illustration purposes only, and are not drawn according to the original scale. For ease of understanding, the same reference numbers are used in the drawings and the description to refer to the same or like parts.

In addition, the terms used in the entire description and the scope of the patent application, unless otherwise specified, usually have the usual meaning of each term used in this field, in the content disclosed here and in the special content. Some terms used to describe the disclosure are discussed below or elsewhere in this specification to provide additional guidance to those skilled in the art in the disclosure.

In the implementation mode and the scope of the present application, unless the article is specifically limited in the context, "a" and "the" can generally refer to a single or pluralities. In the steps, the numbering is only used to conveniently describe the steps, rather than to limit the sequence and implementation.

Secondly, the words "comprising", "including", "having", "containing" and the like used in the present application are all open language, meaning including but not limited to.

Figure 2:
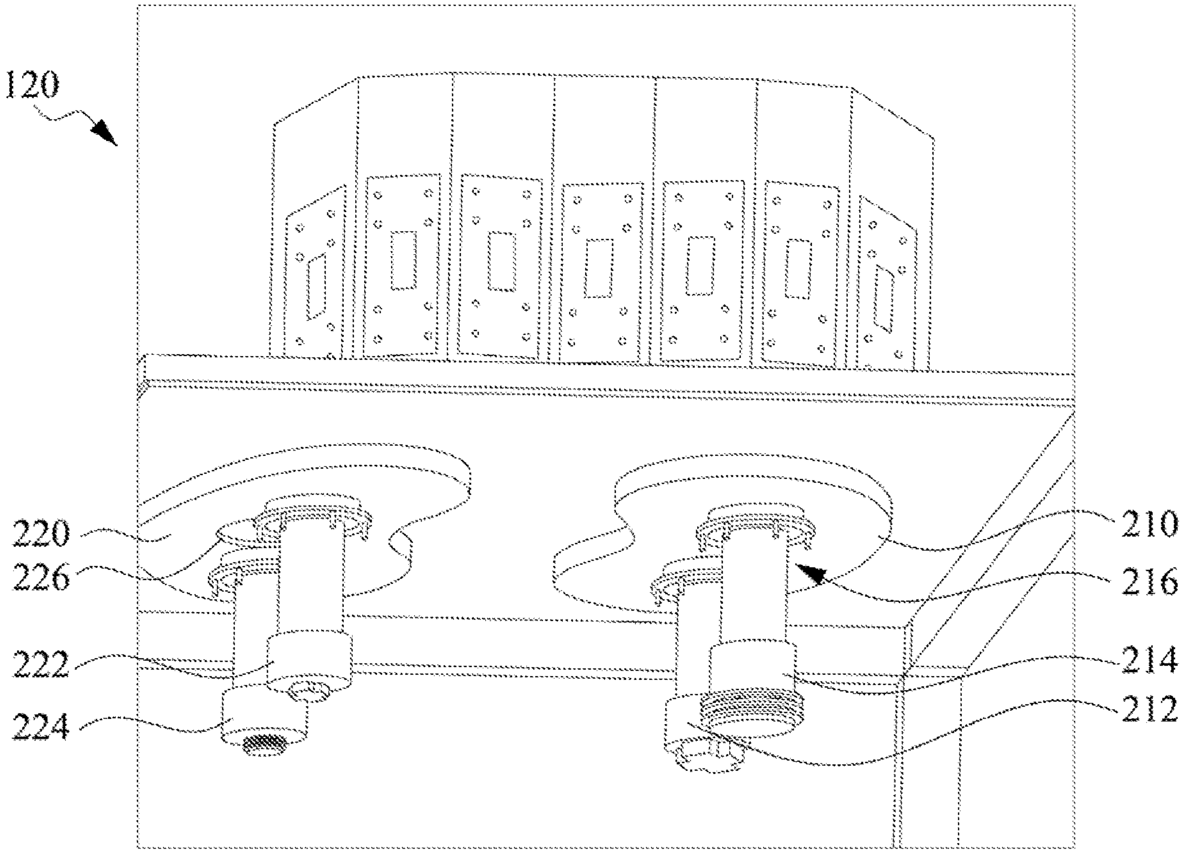
FIG. 2 illustrates a schematic diagram showing a connection module of the chemical liquid supply equipment of FIG. 1.
Figure 3:
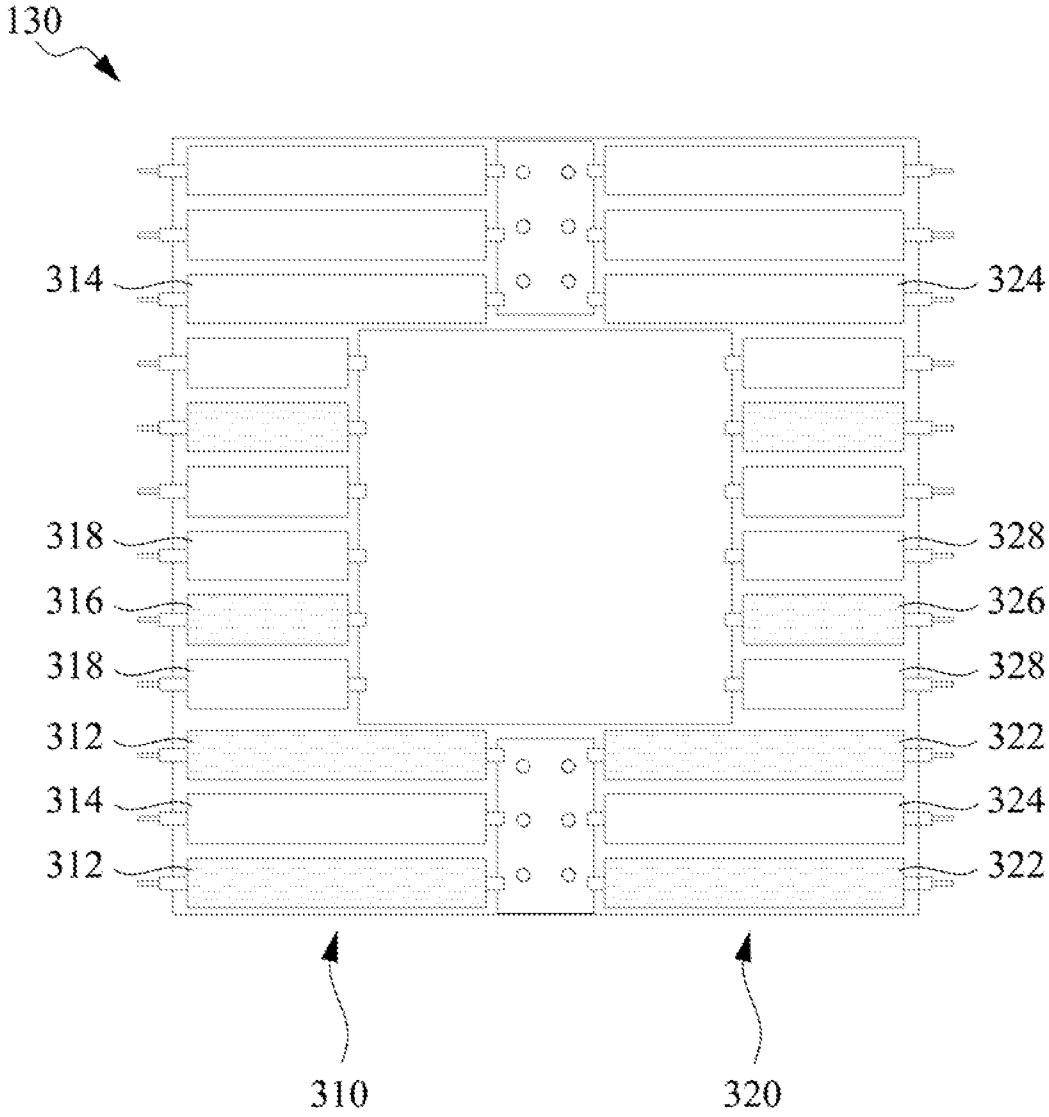
FIG. 3 illustrates a schematic diagram showing a chemical drum rotating and conveying module of the chemical liquid supply equipment of FIG. 1.
Figure 4:
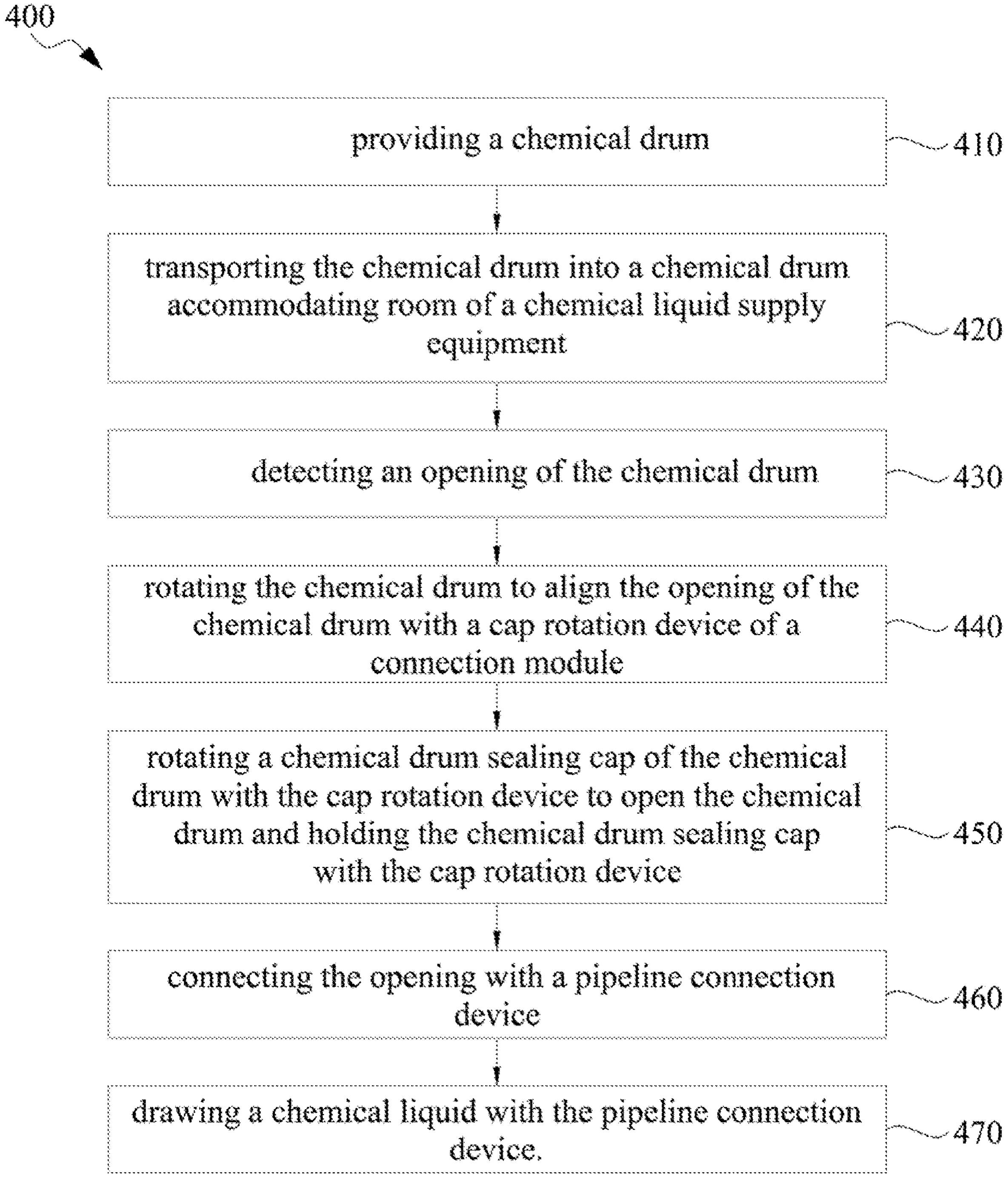
FIG. 4 illustrates a flow chart of a chemical liquid supply method according to another aspect of the present invention.
Figure 5:
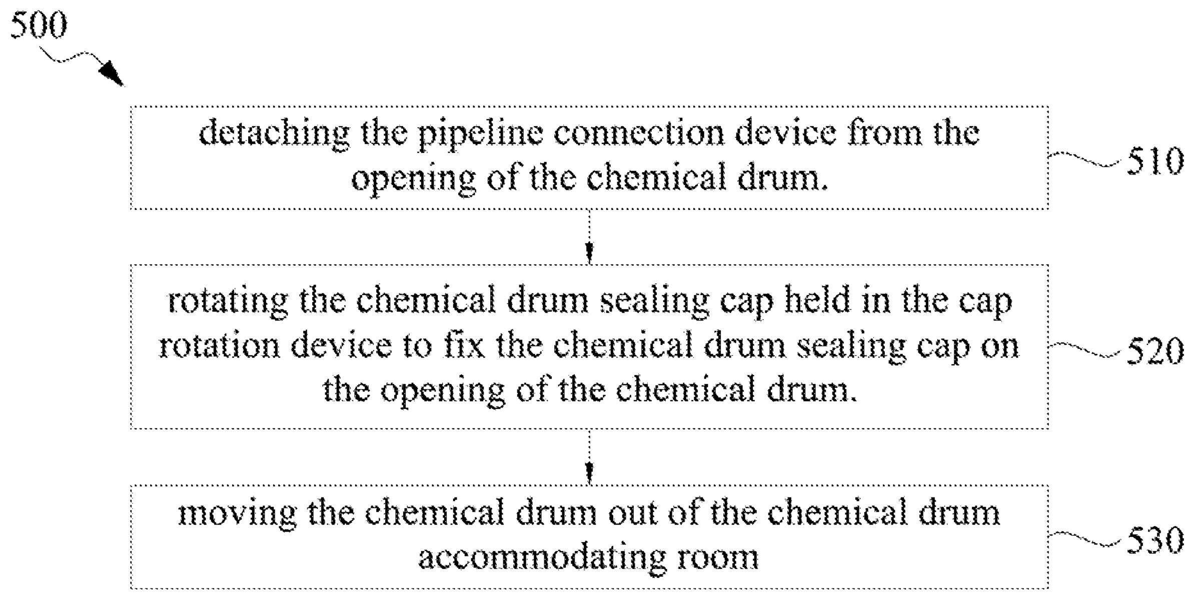
FIG. 5 illustrates a flow chart of chemical drum removal steps of the chemical liquid supply method.
Figure 6:
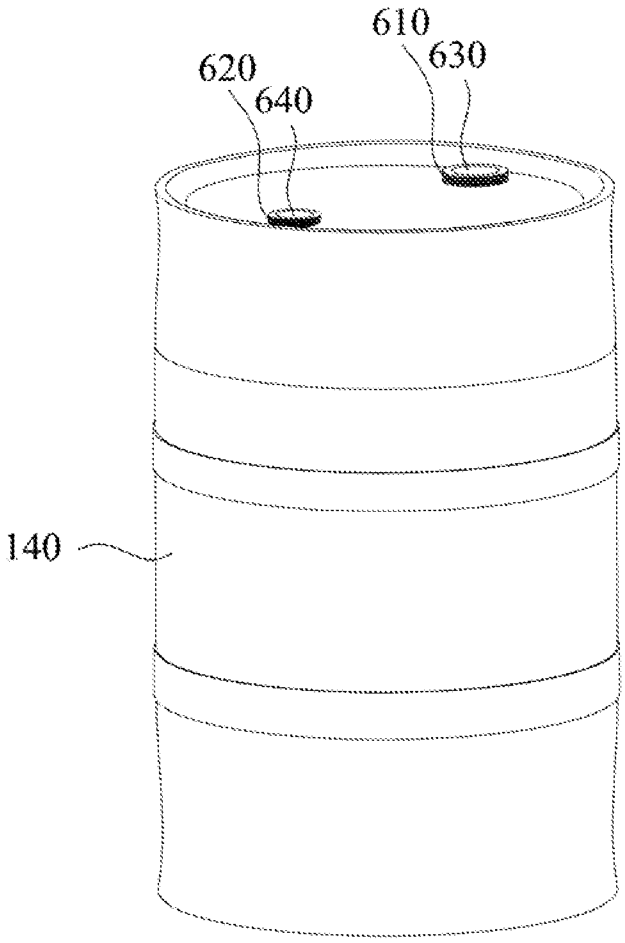
FIG. 6 illustrates a schematic diagram of a chemical drum.

FIG. 1 illustrates a chemical liquid supply equipment according to one embodiment of the present invention, FIG. 2 illustrates a connection module thereof, and FIG. 3 illustrates a chemical drum rotating and conveying module thereof. In addition, FIG. 4 illustrates a flow chart of a chemical liquid supply method according to another aspect of the present invention, FIG. 5 illustrates a flow chart of chemical drum removal steps thereof and FIG. 6 illustrates a chemical drum.

First referring to FIG. 1, as shown in the drawing, the chemical liquid supply equipment 100 includes a casing 110, a connection module 120 and a chemical drum rotating and conveying module 130. The casing 110 has at least one chemical drum accommodating room 160, and each chemical drum accommodating room 160 is equipped with a connection module 120. In addition, the chemical drum rotating and conveying module 130 is also equipped in the chemical drum accommodating room 160 of the casing 110 to transport a chemical drum 140 into the chemical drum accommodating room 160, and rotate the chemical drum 140 to align with the connection module 120.

The chemical drum rotating and conveying module 130 may position and rotate the chemical drum 140 to guide the chemical drum 140 into alignment with the connection module 120. Therefore, the required length of the connection module 120 may be effectively reduced, and the required rotation angle of the connection module 120 may also be effectively reduced, for example, the chemical drum 140 may align with the connection module 120 within a clockwise or counterclockwise rotation angle of less than 30 degrees rather than a rotation angle of a conventional connection module has to be greater than +−180 degrees, such as +−200 degrees, to ensure that the conventional connection module may connect to the chemical drum 140. Therefore, the chemical liquid supply equipment 100 may simplify the structure of the connection module 120, reduce the manufacturing cost of the chemical liquid supply equipment 100, and further improve the supply quality and efficiency of the chemical liquid supplied by the chemical liquid supply equipment 100.

In some embodiments, the chemical liquid supply equipment 100 further includes at least one guiding plate 150 disposed in the chemical drum accommodating room 160 of the casing 110 and located between the connection module 120 and the chemical drum rotating and conveying module 130 to effectively guide the chemical drum 140 to a desired position and angle. One side of the guiding plate 150 for contacting the chemical drum 140 has an arc surface similar to the contour of the chemical drum 140. When the chemical drum 140 is contacting the guiding plate 150, the guiding plate 150 may limit a further forward movement of the chemical drum 140 and also limit a further left or right movement of the chemical drum 140 so as to improve the alignment efficiency and accuracy of the chemical drum 140 and the connection module 120, and reduce the pipeline length of the connection module 120 and the rotation angle of the pipeline of the connection module 120.

In some embodiments, simultaneously referring to FIG. 3, the chemical drum rotating and conveying module 130 includes a first conveying device 310 and a second conveying device 320. The first conveying device 310 and the second conveying device 320, preferably disposed in parallel left and right, may shift and rotate the chemical drum 140.

In some embodiments, the first conveying device 310 includes a plurality of first power rollers 312, a plurality of first idler rollers 314, a plurality of second power rollers 316 and a plurality of second idler rollers 318. The first power rollers 312, the first idler rollers 314, the second power rollers 316 and the second idler rollers 318 are preferably arranged in parallel front to back.

In some embodiments, the second conveying device 320 includes a plurality of first power rollers 322, a plurality of first idler rollers 324, a plurality of second power rollers 326 and a plurality of second idler rollers 328. The first power rollers 322, the first idler rollers 324, the second power rollers 326 and the second idler rollers 328 are preferably arranged in parallel front to back.

That is to say, when the first conveying device 310 and the second conveying device 320 both rotate in the same direction, the first conveying device 310 and the second conveying device 320 may move the chemical drum 140 into the chemical drum accommodating room 160 or withdraw the chemical drum 140 from the chemical drum accommodating room 160. When the first conveying device 310 and the second conveying device 320 are rotated in different directions, the first conveying device 310 and the second conveying device 320 may rotate the chemical drum 140 to a desired angle to align the chemical drum 140 with the connection module 120.

In some embodiments, the length of the first power rollers 312 is greater than the length of the second power rollers 316, and the length of the first idler rollers 314 is greater than the length of the second idler rollers 318.

In some embodiments, the length of the first power rollers 312 is equal to the length of the first idler rollers 314, and the length of the second power rollers 316 is equal to the length of the second idler rollers 318.

With the same manner, the length of first power rollers 322 of the second conveying device 320 is greater the length of the second power rollers 326, and the length of the first idler rollers 324 is greater than the length of the second idler rollers 328.

In some embodiments, the length of the first power rollers 322 is equal to the length of the first idler rollers 324, and the length of the second power rollers 326 is equal to the length of the second idler rollers 328.

In addition, the first power rollers 312 and the first power rollers 322 are preferably located at the entrance of the chemical drum accommodating room 160, and the first idler rollers 314 and the first idler rollers 324 are located at the entrance of the chemical drum accommodating room 160 behind the first power rollers 312 and the first power rollers 322 and also located at the end portion of the chemical drum rotating and conveying module 130 so as to reduce the quantity of the power rollers. The length of the second power rollers 316 and the second idler rollers 318 located in the middle portion of the first conveying device 310 and the length of the second power rollers 326 and the second idler rollers 328 located in the middle portion of the second conveying device 320 have a shorter length, compared with the length of the first power rollers 312, the first power rollers 322, the first idler rollers 314 and the first idler rollers 324, so as to form an opening in the chemical drum rotating and conveying module 130, and the short second power rollers 316, the short second idler rollers 318, the short second power rollers 326 and the short second idler rollers 328 may reduce the length and cost of the rollers and improve the supporting strength of the rollers so as to prevent from the roller deformation and precisely transport and rotate the chemical drum 140.

In some embodiments, simultaneously referring to FIG. 6, the connection module 120 includes a first connection module 210 and a second connection module 220. The first connection module 210 is utilized to connect to the gas opening 610 of the chemical drum 140, and the second connection module 220 is arranged opposite to the first connection module 210 to connect to the liquid opening 620 of the chemical drum 140.

In some embodiments, the first connection module 210 includes a cap rotation device 212, a pipeline connection device 214 and an optical detecting device 216. The cap rotation device 212 is utilized to rotate a chemical drum sealing cap 630 on the gas opening 610 of the chemical drum 140, the pipeline connection device 214 is utilized to connect the gas opening 610 of the chemical drum 140, and the optical detecting device 216 is disposed between the cap rotation device 212 and the pipeline connection device 214 to detect the position of the gas opening 610 of the chemical drum 140.

In some embodiments, the second connection module 220 includes a cap rotation device 222, a pipeline connection device 224 and an optical detecting device 226. The cap rotation device 222 is utilized to rotate a chemical drum sealing cap 640 on the liquid opening 620 of the chemical drum 140, the pipeline connection device 224 connects the liquid opening 620 to draw or reflow a chemical liquid of the chemical drum 140, and the optical detecting device 226 is disposed between the cap rotation device 222 and the pipeline connection device 224 of the second connection module 220 to detect a position of the liquid opening 620 of the chemical drum 140.

In some embodiments, the diameter of the gas opening 610 is greater than the diameter of the liquid opening 620.

In some embodiments, the cap rotation device 212 of the first connection module 210 is located 180 degrees away from the cap rotation device 222 of the second connection module 220, and the pipeline connection device 214 of the first connection module 210 is located 180 degrees away from the pipeline connection device 224 of the second connection module 220.

According to another aspect of the present invention, a chemical liquid supply method 400 is provided. Referring to FIG. 4 and FIG. 5, as shown in the drawings, the chemical liquid supply method 400 includes the following steps. First, in step 410, a chemical drum 140 is provided, and then, in step 420, a chemical drum 140 is transported into the chemical drum accommodating room 160 of the chemical liquid supply equipment 100. In step 430, the chemical liquid supply equipment 100 detect an opening, i.e. a gas opening 610 and/or a liquid opening 620, of the chemical drum 140. Subsequently, in step 440, the chemical liquid supply equipment 100 utilizes the chemical drum rotating and conveying module 130 to rotate the chemical drum 140 to allow the opening of the chemical drum 140 aligning with a cap rotation device, i.e. a cap rotation device 212 and/or a cap rotation device 222, of the connection module 120 according to the position of the opening.

Subsequently, in step 450, the cap rotation device 212 and the cap rotation device 222 rotate the chemical drum sealing cap 630 and the chemical drum sealing cap 640 on the gas opening 610 and the liquid opening 620 of the chemical drum 140 to open the chemical drum 140, and the chemical drum sealing cap 630 and the chemical drum sealing cap 640 are therefore held in the cap rotation device 212 and the cap rotation device 222.

Then, in step 460, the pipeline connection devices, i.e. a pipeline connection device 214 and a pipeline connection device 224, are connected to the gas opening 610 and the liquid opening 620 of the chemical drum 140. In step 470, the pipeline connection device 224 draws the chemical liquid and the pipeline connection device 214 exhausts or intakes air for the chemical drum 140.

In addition, referring to FIG. 5, the chemical drum removal steps 500 of the chemical liquid supply method 400 is illustrated. After the required chemical liquid is provided to the manufacturing process, in step 510, the chemical liquid supply equipment 100 may automatically detach the pipeline connection device 214 from the gas opening 610 of the chemical drum 140, and the pipeline connection device 224 from the liquid opening 620 of the chemical drum 140. Subsequently, in step 520, the chemical drum sealing cap 630 and the chemical drum sealing cap 640 held in the cap rotation device 212 and the cap rotation device 222 are rotated to fix on the gas opening 610 and the liquid opening 620 to seal the chemical drum 140. In addition, in step 530, the chemical drum rotating and conveying module 130 moves the chemical drum 140 out of the chemical drum accommodating room 160.

Accordingly, the chemical liquid supply equipment may safely and reliably connect the chemical drum with the connection module, and utilize the chemical drum rotating and conveying module to conveniently and precisely align the connection module with the chemical drum so as to effectively reduce the required length and the rotational angle of the pipelines and improve the efficiency and precision of the installation and removal of the chemical drum in the chemical liquid supply equipment.

Although the present disclosure has been disclosed above in terms of implementation, it is not intended to limit the present disclosure. Any person with ordinary knowledge in the field may make various variations and modifications without departing from the spirit and scope of the disclosure. Therefore, the spirit and scope of the appended claims should not be limited to the description of the embodiments contained herein.

What is claimed is:

1. A chemical liquid supply equipment, comprising:

a casing having a chemical drum accommodating room;

a connection module equipped in the chemical drum accommodating room of the casing; and a chemical drum rotating and conveying module equipped in the chemical drum accommodating room of the casing to transport the chemical drum into the chemical drum accommodating room and simultaneously transport and rotate the chemical drum to align with the connection module, wherein the chemical drum rotating and conveying module, comprising:

a first conveying device; and a second conveying device, wherein the first conveying device and the second conveying device are disposed in parallel to move and rotate the chemical drum, wherein the first conveying device and the second conveying device respectively comprise:

two first power rollers;

a first idler roller disposed in parallel with and between the two first power rollers;

a second power roller disposed in parallel with the two first power rollers and the first idler roller; and two second idler rollers disposed in parallel with the two first power rollers, the first idler roller and the second power roller, wherein the second power roller is disposed between the two second idler rollers, wherein a length of the two first power rollers is greater than a length of the second power roller, and a length of the first idler roller is greater than a length of the two second idler rollers, and the length of the two first power rollers is equal to the length of the first idler roller, and the length of the second power roller is equal to the length of the two second idler rollers.

2. The chemical liquid supply equipment of claim 1, further comprising:

a guiding plate disposed in the chemical drum accommodating room of the casing, and located between the connection module and the chemical drum rotating and conveying module to guide the chemical drum.

3. The chemical liquid supply equipment of claim 1, wherein the connection module, comprising:

a first connection module connecting to a gas opening of the chemical drum; and a second connection module, disposed opposite to the first connection module, to connect to a liquid opening of the chemical drum.

4. The chemical liquid supply equipment of claim 3, wherein the first connection module, comprising:

a cap rotation device rotating a chemical drum sealing cap of the gas opening of the chemical drum;

a pipeline connection device connecting the gas opening of the chemical drum; and an optical detecting device, disposed between the cap rotation device and the pipeline connection device, to detect a position of the gas opening of the chemical drum.

5. The chemical liquid supply equipment of claim 4, wherein the second connection module, comprising:

a cap rotation device rotating a chemical drum sealing cap of the liquid opening of the chemical drum;

a pipeline connection device connecting the liquid opening to draw or reflow a chemical liquid of the chemical drum; and an optical detecting device, disposed between the cap rotation device and the pipeline connection device of the second connection module, to detect a position of the liquid opening of the chemical drum.

6. The chemical liquid supply equipment of claim 5, wherein the cap rotation device of the first connection module is 180 degrees away from the cap rotation device of the second connection module, and the pipeline connection device of the first connection module is 180 degrees away from the pipeline connection device of the second connection module.

7. A chemical liquid supply method, comprising:

providing a chemical drum;

transporting the chemical drum by a chemical drum rotating and conveying module of a chemical liquid supply equipment into a chemical drum accommodating room of the chemical liquid supply equipment;

detecting an opening of the chemical drum; and simultaneously transporting and rotating the chemical drum by the chemical drum rotating and conveying module to align the opening of the chemical drum with a cap rotation device of a connection module of the chemical liquid supply equipment.

8. The chemical liquid supply method of claim 7, further comprising:

rotating a chemical drum sealing cap with the cap rotation device to open the chemical drum and holding the chemical drum sealing cap with the cap rotation device.

9. The chemical liquid supply method of claim 8, further comprising:

connecting the opening with a pipeline connection device of the chemical liquid supply equipment.

10. The chemical liquid supply method of claim 9, further comprising:

drawing a chemical liquid of the chemical drum with the pipeline connection device.

11. The chemical liquid supply method of claim 10, further comprising:

detaching the pipeline connection device from the opening of the chemical drum.

12. The chemical liquid supply method of claim 11, further comprising:

rotating the chemical drum sealing cap held in the cap rotation device to fix on the opening of the chemical drum.

13. The chemical liquid supply method of claim 12, further comprising:

moving the chemical drum out of the chemical drum accommodating room by the chemical drum rotating and conveying module.

14. The chemical liquid supply method of claim 7, wherein the opening of the chemical drum comprises a gas opening or a liquid opening.

15. The chemical liquid supply method of claim 14, further comprising intaking an air for the chemical drum.

16. The chemical liquid supply method of claim 14, further comprising exhausting an air from the chemical drum.

* * * * *